US006129866A

United States Patent [19]

Hamanaka et al.

[11] Patent Number: 6,129,866

[45] Date of Patent: Oct. 10, 2000

[54] STAMPER FOR USE IN FORMING PLANAR MICRO-LENS ARRAY AND METHOD FOR FORMING THEREOF

[75] Inventors: Kenjiro Hamanaka; Satoshi Taniguchi; Kenji Morio, all of Kanagawa, Japan

[73] Assignee: Nippon Sheet Glass Co., Ltd., Osaka, Japan

[21] Appl. No.: 09/176,191

[22] Filed: Oct. 21, 1998

[30] Foreign Application Priority Data

Oct. 22, 1997 [JP] Japan .................................... 9-289517

[51] Int. Cl.$^{7}$ ...................................................... B29D 11/00

[52] U.S. Cl. ............................ 264/1.7; 216/24; 264/1.38; 264/2.5; 425/174.4; 425/175

[58] Field of Search .............................. 264/1.7, 2.5, 1.1, 264/1.36, 1.38; 425/174.4, 810, 808, 175; 216/24, 26

[56] References Cited

U.S. PATENT DOCUMENTS

| | | | |
|---|---|---|---|
| 5,225,935 | 7/1993 | Watanabe et al. | 264/2.5 |
| 5,298,366 | 3/1994 | Iwasaki et al. | 264/2.5 |
| 5,300,263 | 4/1994 | Hoopman et al. | 264/2.5 |
| 5,439,621 | 8/1995 | Hoopman | 264/2.5 |
| 5,630,902 | 5/1997 | Galarneau et al. | 425/174.4 |

FOREIGN PATENT DOCUMENTS

| | | |
|---|---|---|
| 9-90360 | 4/1997 | Japan . |

*Primary Examiner*—Mathieu D. Vargot
*Attorney, Agent, or Firm*—Pillsbury Madison & Sutro LLP

[57] ABSTRACT

For providing a stamper for forming a planar micro-lens array, a stamper is prepared by forming plural concave portions 2 for forming lens portion upon a stamping surface thereof, and a trap portion 3 is provided surrounding said plural concave portions and continuing until an outer edge thereof. Then, onto the stamping surface, on which a release agent 4 is applied, there is applied a high refractive index resin 5, and a glass substrate 6 is pressed onto the high refractive index resin 5 to exude it. With this operation, the high refractive index resin 5 is filled into each of the plural concave portions 2, and any excess is received or accommodated in the trap portion 3, thereby preventing excess resin from being forced outside.

11 Claims, 7 Drawing Sheets

FIG. 3(a)
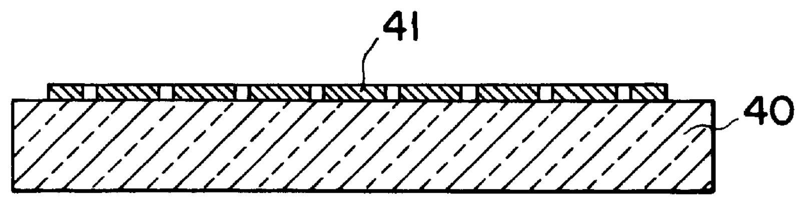
FIG. 3(b)
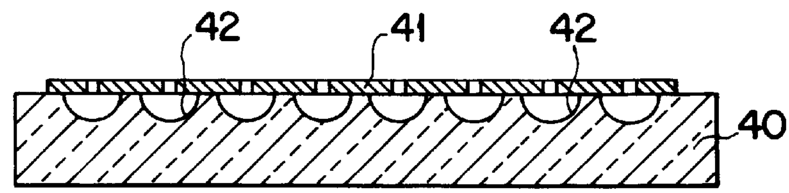
FIG. 3(c)
43 42 42 43 40
FIG. 3(d)
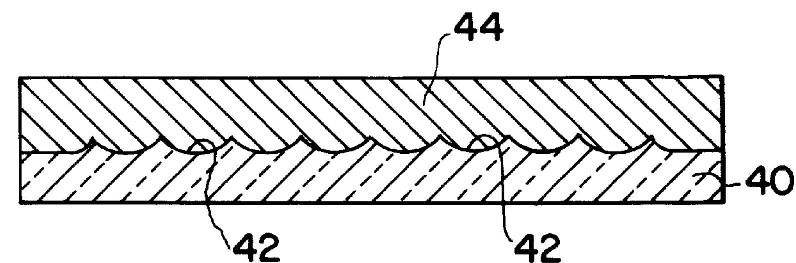
FIG. 3(e)
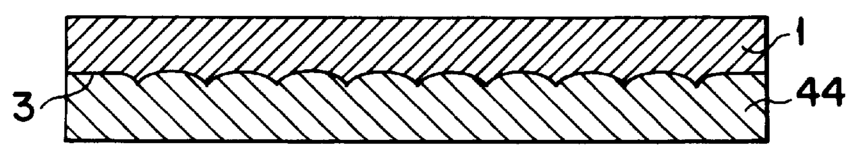

STAMPER FOR USE IN FORMING PLANAR MICRO-LENS ARRAY AND METHOD FOR FORMING THEREOF

BACKGROUND OF THE INVENTION

1. Field of the Invention

The present invention relates to a stamper for use in forming a large number of convex lens comprising resin having a high refractive index upon a surface of glass substrate, and also to a method for producing a plate-like micro-lens array by use of the stamper.

2. Description of Related Art

A flat-type or plate-like (planar) micro-lens array is installed into, for example, a part of a liquid crystal display element. Explaining a structure of such a liquid crystal display element by referring to FIG. 7, a gap is formed between glass substrates 101 and 102 by a spacer 103, into which liquid crystal 104 is poured. On a surface of the glass substrate 101 there are formed opposing electrodes 101*a* at the side of the liquid crystal 104, and on a surface of the other glass substrate 102 there are formed transparent pixel electrodes 102*a* at the side of the liquid crystal 104. Further, additional portions other than the transparent pixel electrodes 102*a* are formed which are not transparent, such as wiring, TFTs (thin film transistors), etc.

Next, upon an exterior surface of the glass substrate 101 there is bonded a planar micro-lens array 105, serving to focus irradiated light through the lens portion 106 thereof into pixel electrodes (i.e., openings for the pixels) 102*a*, so as to increase the brightness of an image projected upon the screen. Not that the pixels and lenses (lens elements) are provided in plural numbers.

An example of the method for producing such a planar micro-lens array 105 will be explained by referring to FIG. 8 attached.

First, recessed portions 111 are formed on the surface of the glass substrate 110 through an etching process, and then a resin of high refractive index 112 is applied thereupon and is spread over the surface of the glass substrate 110 by a stamper 113 so as to fill in plural recessed portions 111. Next, the high refractive index resin 112 is cured under light, thereby obtaining the lens portion 106 mentioned above.

However, in the case of producing or forming the planar micro-lens array with the method mentioned above, any of the high refractive index resin that is excess is pushed or forced out from the edge of the glass substrate and is cured during the curing process. As a result, the planar micro-lens array itself becomes larger in dimension thereof, such that it cannot be bonded or attached on the other element(s) and its size does not fit with the other portions for installation therewith. This is a disadvantage. Further, if the high refractive index resin exudes to the reverse of the substrate, the planar micro-lens array will experience degraded performance.

Furthermore, when a plurality of planar micro-lens arrays are cut out from a large-sized glass substrate on which multiple surfaces are formed, since the high refractive index resin forms a layer applied over the entire surface of the glass substrate, the layer of the high refractive index resin might be easily separated or exfoliated therefrom, or the surface of the micro-lens array may be damaged during a subsequent cutting procedure.

Therefore, the applicant of the present application already proposed a structure, disclosed in Japanese Patent Application No. Hei-7244288 (1995), in which a gutter portion 113 is formed surrounding the outside of the recessed portions 111 so as to receive or accommodate any high refractive index resin that exudes in excess therefrom, as shown in FIG. 9.

However, a problem lying in the method shown in Japanese Patent Application No. Hei-7244288 (1995) is that since the etching is performed on the glass substrate itself forming the planar micro-lens array, the etching must be performed on the glass substrate every time before applying the high refractive index resin thereon.

Further, as shown in FIG. 9, the gutter portion 113 is formed at the same time that the recessed portions 111 are formed by the etching, and therefore the depth of it comes to be same to those of the recessed portions 111. As a result, there is a possibility that the gutter portion 113 will have insufficient volume, though it may still be partially adequate. Nonetheless, any excess high refractive index resin cannot be accommodated or received therein with certainty.

SUMMARY OF THE INVENTION

To resolve the problems described above, according to the present invention, there is provided a stamper for use in forming a planar micro-lens array, comprising a plurality of convex high refractive resin portions for forming lenses, which is applied onto a planar surface of a glass substrate, in which, after the high refractive resin material is applied to plural concave portions of said stamper, the planar glass substrate is contacted thereon to exude the resin in between the concave portions and the glass plate, and is cured and separated therefrom, characterized in that the plurality of concave portions for forming lenses of said micro-lens array are formed on a stamping surface of said stamper by transcription or etching, and in that a trap portion is formed at an outer periphery of the lens of said stamping surface of said stamper by transcription or etching, with a depth substantially equal to that of said concave portions, continuing at least until an outside edge of a region where said glass substrate is to be contacted therewith.

With the construction according to the present invention, the trap portion can be formed large enough to effectively prevent any excess high refractive index material from being pushed or forced out.

Here, also according to the present invention, said stamper is formed with laminated layers of nickel, which are formed by performing an electro-forming process upon a surface of a master plate of said micro-lens array (transcription), or alternatively, after forming a plurality of small concave portions upon a surface of a glass plate as a model for said stamper by wet etching, a reverse mold is formed with laminated layers of nickel, which are formed by performing the electro-forming process upon the surface of the glass substrate having the plural concave portions, and then said stamper is formed with laminated layers of nickel by performing the electro-forming process upon the surface of the reverse mold having the plural convex portions thereon, or said stamper is formed with a glass substrate, upon a surface of which there are directly formed a large number of concave portions by a wet etching process.

Further, according to the present invention, in the stamper, wherein in the stamping surface of said stamper there are formed plural groups of concave portions, corresponding to plural planar micro-lens arrays, each being separate, said trap portion is formed at each outside periphery of each group of the concave portions for each planar micro-lens array, with the depth substantially equal to that of said concave portions.

Moreover, according to the present invention, there is provided a method for forming a planar micro-lens array by use of the stamper as defined above, comprising the steps of:

turning a stamping surface of said stamper upward, upon which surface is applied a release agent;

applying high refractive resin material upon the stamping surface of said stamper;

pressing a glass substrate upon the high refractive resin material to exude the high refractive resin material into the concave portions and then curing the high refractive resin material to form the lens portions and thereafter;

releasing the stamper to leave the planar micro-lens array formed on said glass surface; and again applying the release agent upon a molding surface of said stamper after the release thereof, in preparation for a subsequent process.

With the steps mentioned above, since the etching must be performed only when the stamper is produced, it is possible to greatly reduce the scale or the number of production processes, as well as to prevent any excess high refractive index resin from being forced out.

Here, as the glass substrate for forming the planar micro-lens array, there can be listed soda-lime glass, alkaline aluminosilicate glass, alkaline borosilicate glass, non-alkaline glass, crystallized glass, quartz glass, etc. In addition, those glass materials can be used as the material of the stamper.

Further, as the high refractive index material, there can be listed polyester resin, epoxy resin, silicon resin, phosphazene resin, phenol resin, polyimide resin, acryl resin, urethane resin, etc.

Further, the release agent to be applied upon the stamping surface of the stamper is appropriately a compound of fluorine group or a compound containing silicon group. Also, as an organic compound of the silicon group, preferably a resolvable one, which mainly contains polysiloxane, chlorsilane compound, alkoxysilane compound, disiloxane compound, and is resolvable into water soluble organic solvent, such as water or alcohol, or resolvable into hydrocarbon organic solvent or fluorine organic solvent, is used.

Further, those which contain fluorine in the organic compound of the silicon group are very low in surface tension at the release surface of the mold, and therefore, they exhibit good release qualities. Those can also be used in a mixture thereof.

BRIEF DESCRIPTION OF DRAWINGS

FIGS. 3 (*a*) through (*e*) show another embodiment of the method for preparing the stamper;

DESCRIPTION OF THE PREFERRED EMBODIMENTS

Figure 1A:
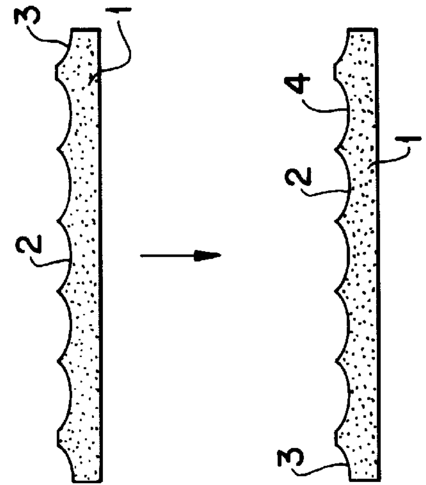
FIGS. 1 (*a*) through (*f*) are views for explaining a forming method by use of a stamper according to the present invention.
Figure 1B:
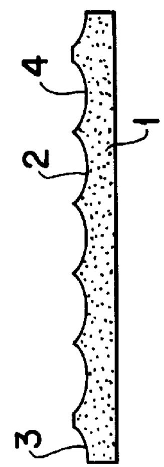
Figure 1F:
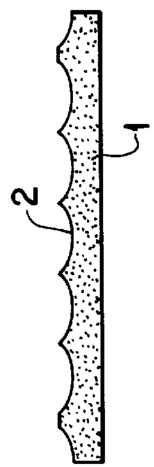
Figure 1C:
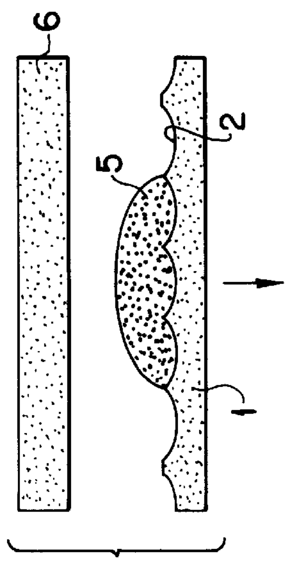
Figure 1D:
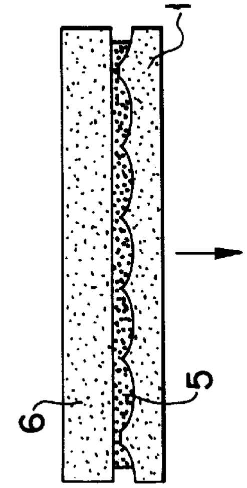
Figure 1E:
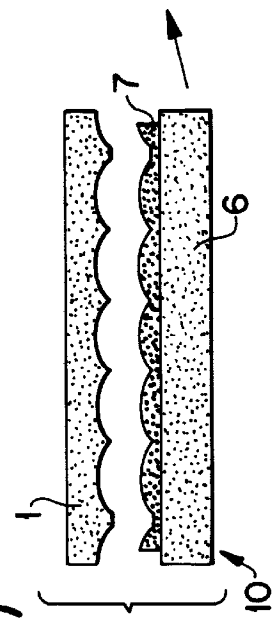
Figure 2A:
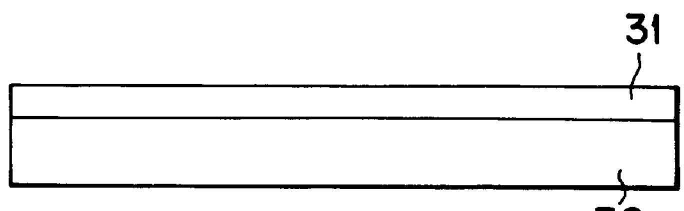
FIGS. 2 (*a*) through (*d*) show a method for preparing the stamper.
Figure 2B:
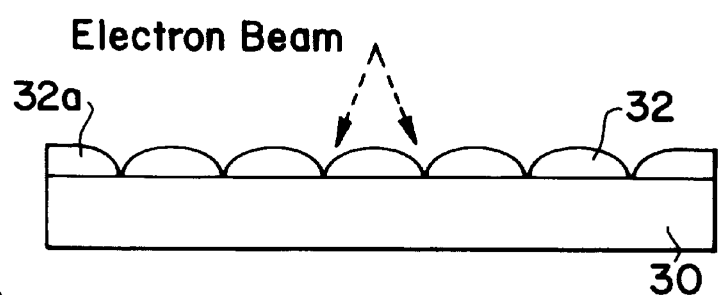
Figure 2C:
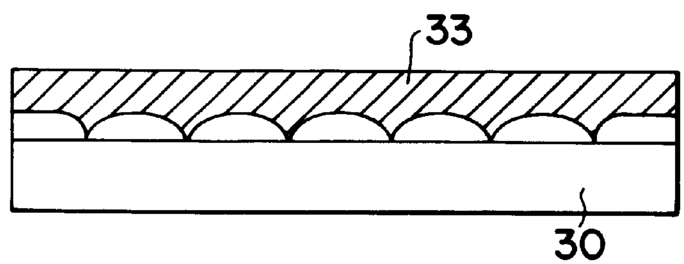
Figure 2D:
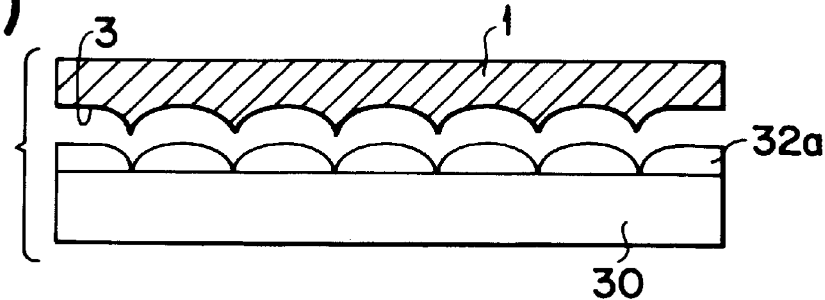

Hereinafter, detailed explanation of the embodiments according to the present invention will be given by referring to the attached drawings. Here, as shown in FIGS. 1 (*a*) through (*f*) explaining the forming method by use of a stamper according to the present invention, the stamper 1 is manufactured by means of an electro-forming or wet etching process, as shown in FIG. 1 (*a*). Upon a molding or stamping surface of this stamper 1 there is formed plural concave portions 2 for forming lens elements, and a trap portion 3 is formed all around the plural concave portions, continuing until an outer edge thereof. The depth of this trap portion 3 is substantially equal to those of the plural concave portions 2.

Here, an example of the method for preparing the stamper 1 will be explained on the basis of FIGS. 2 (*a*) to (*d*) and FIGS. 3 (*a*) to (*e*).

First, in the method shown in FIGS. 2 (*a*) to (*d*), a layer of photo-sensitive film 31 is formed on a surface of a substrate 30, as show in FIG. 2 (*a*), and then, as shown in FIG. 2 (*b*), upon the photo-sensitive film 31 there is irradiated an electron beam to manufacture a master micro-lens array, in which convex portions 32*a* are formed for subsequently forming the lens elements 32 and the trap portion 3.

Next, as shown in FIG. 2 (*c*), a nickel layer 33 is laminated upon the surface of the master micro-lens array by means of an electro-forming method, and further, as shown in FIG. 2 (*d*), the laminated layer is later separated from the master micro-lens array thus obtaining a stamper 1.

Also, in another method shown in FIGS. 3 (*a*) to (*e*), upon the surface of a glass substrate 40 serving as a model, as shown in FIG. 3 (*a*), a wet etching is performed through a mask 41, and as shown in FIG. 3 (*b*), plural minute concave portions 42 are formed having a spherical or cylindrical surface shape, together with a trap portion 43. Further, as shown in FIG. 3 (*c*), the wet etching is again performed without the mask so as to form plural small concave portions closely arrayed next to each other and aligned with one another. Then, as shown in FIG. 3 (*d*), a nickel layer is laminated onto the surface, on which the plural concave portions are formed closely arrayed and aligned, by means of an electro-forming method, to form a reverse mold 44. Further, by again laminating the nickel layer upon the surface of this reverse mold 44 by means of the electro-forming method, the stamper 1 can be obtained.

However, the stamper 1 also can be manufactured with a glass substrate by the process shown in FIGS. 3 (*a*) to (*c*).

When the stamper 1 is prepared in the manner mentioned above, a release agent 4 is applied onto the molding or stamping surface of the stamper 1, as shown in FIG. 1 (*b*). On the stamping surface, onto which the release agent 4 is applied, as shown in FIG. 1 (*c*), resin 5 having a high refractive index is applied. The high refractive index resin 5 can be of the light-curable type, which is cured by irradiation of UV (ultra violet) light, or of the heat-curable type, which is cured by applying heat thereto. Further, as shown in FIG. 1 (*d*), the glass substrate 6 is pressed onto the above-mentioned high refractive index resin 5 so as to exude it. However, it is preferable that a coupling agent be applied upon the surface of the glass substrate 6, which contacts with the high refractive index resin 5, in advance. As the coupling agent, there can be considered γ-glycidpropyl-trimethoxy silane or mercapt-propy-trimethoxy silane. Also, the viscosity of the high refractive index resin 5 appropriately lies from 0.1 to 100 poise, and it is effective to apply the resin under a reduced pressure condition in order to prevent creating bubbles therein.

By the operation mentioned above, the high refractive index resin 5 is filled into the plural concave portions 2, and at the same time, any excess high refractive index resin 5 is received into or accommodated by the trap portion 3, and is not disadvantageously forced outside.

When the high refractive index resin 5 is filled in the plural of concave portions 2, UV light is irradiated in order to harden the high refractive index resin 5 to form the lens elements 7.

Since, upon the stamping surface of the stamper 1 there is applied the release agent, while the coupling agent is applied upon the surface of the glass substrate 6 contacting with the high refractive index resin 5, the lens elements 7 are bonded onto the glass substrate 6. Accordingly, as shown in FIG. 1 (*e*), when the stamper 1 is removed or separated, a planar micro-lens array 10 comprising the lens elements 7 on the glass substrate 6 can be obtained.

Moreover, the stamping surface of the stamper 1, after finishing the forming process, as shown in FIG. 1 (*f*), is washed, and the release agent is applied again onto the stamping surface for a subsequent forming operation. In this manner, by using the stamper 1 repeatedly, the etching process is necessary only when the first stamper 1 is manufactured, thereby reducing the complexity and cost of the manufacturing processes greatly.

Figure 4A:
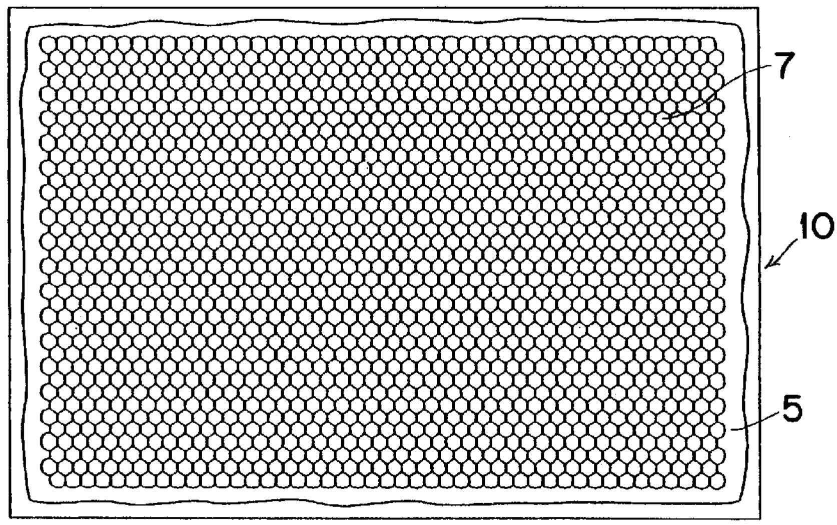
FIGS. 4 (*a*) through (*c*) show plain views of a planar micro-lens array obtained according to the method of the present invention.
Figure 4B:
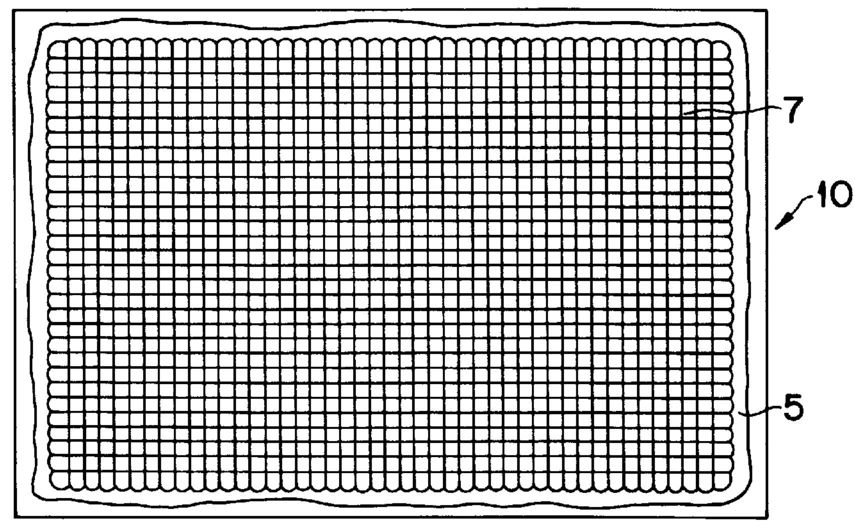
Figure 4C:
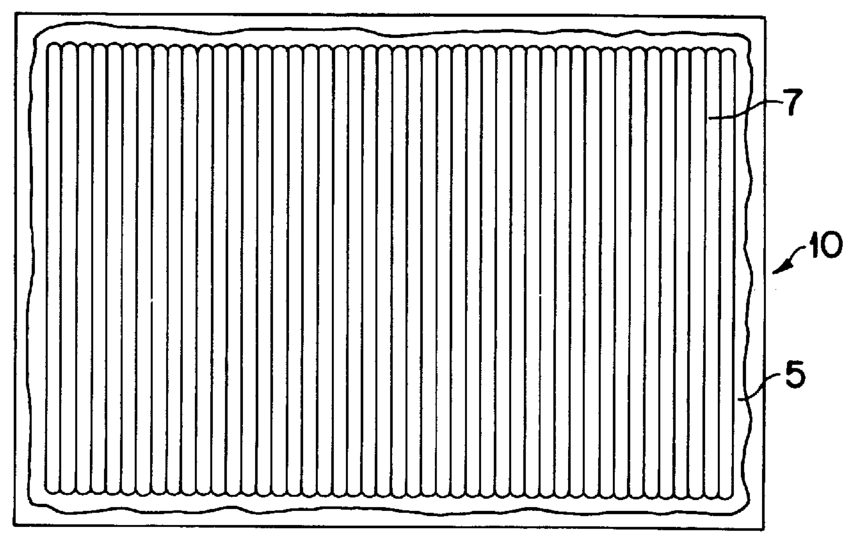

FIGS. 4 (*a*) to (*c*) show a plane view of the planar micro-lens arrays obtained according to the present invention, in particular, FIG. 4 (*a*) shows lenses of a hexagonal shape, FIG. 4 (*b*) a square shape, and FIG. 4 (*c*) a lenticular shape, respectively. All shapes shown may be easily attained according to the method of the present invention, and the invention may equally be applied to preparing lens arrays in other shapes.

Figure 5:
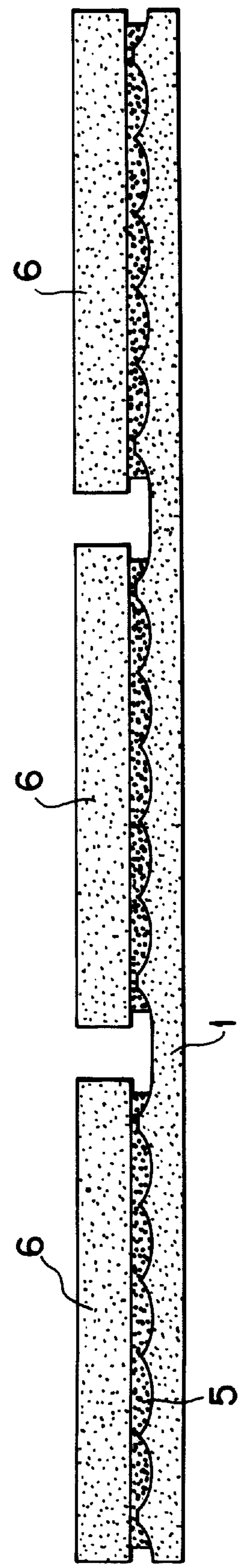
FIG. 5 shows an embodiment in which a plurality of planar micro-lens arrays are formed by one stamper.

FIG. 5 is a view for explaining an embodiment in which plural planar micro-lens arrays are formed by means of a single stamper, wherein the high refractive index resin 5 is applied into each of the plural concave portions 2 of the stamper 1, and plural glass substrates 6 are placed onto the high refractive index resin 5, one by one.

However, not shown in the figure, with the stamper shown in FIG. 5, it is also possible to obtain production of plural planar micro-lens arrays on a large-sized glass substrate, each of which is cut out therefrom afterward.

Figure 6:
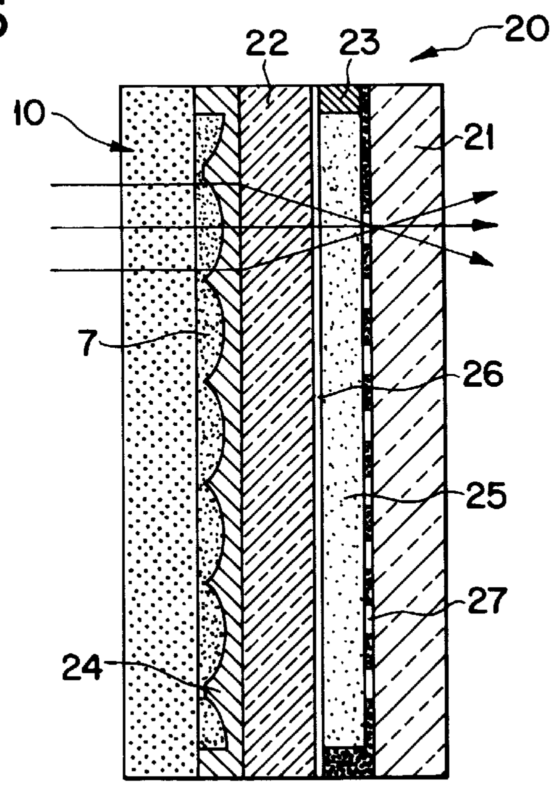
FIG. 6 shows a cross-section view of a liquid crystal display element comprising a planar micro-lens array prepared by the method according to the present invention.
Figure 7:
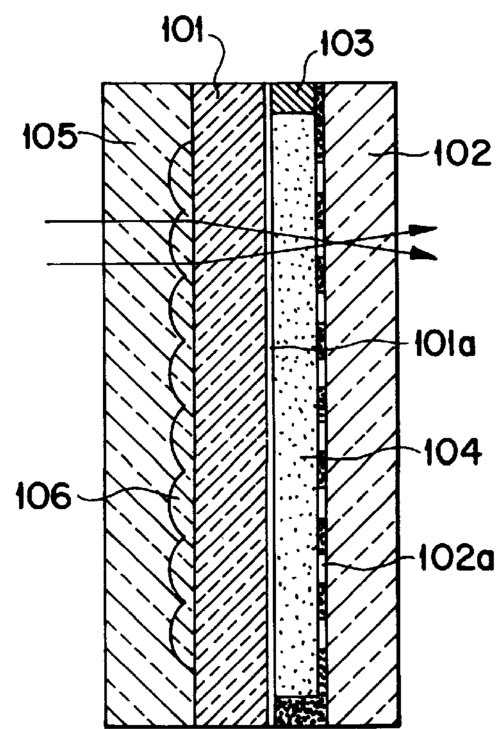
FIG. 7 shows a cross-section view of a conventional liquid crystal display element.
Figure 8:
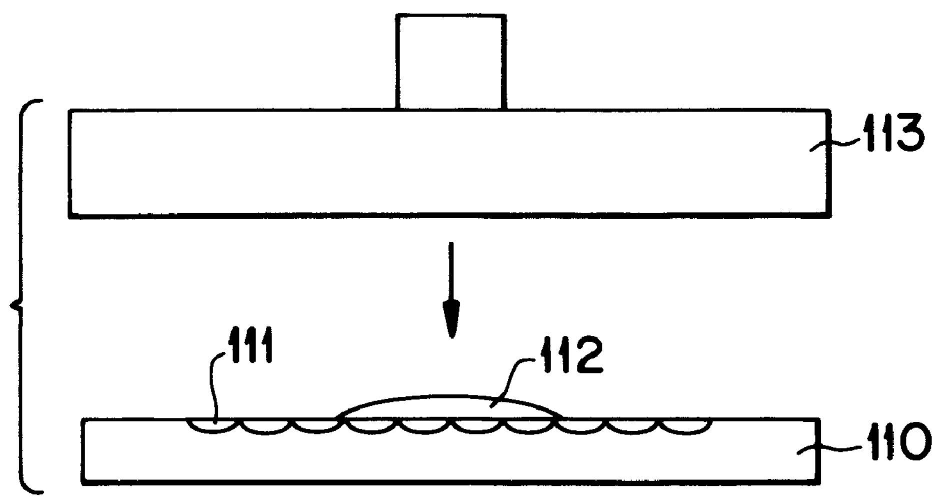
FIG. 8 is a view for explaining a conventional method for forming a planar micro-lens array.
Figure 9:
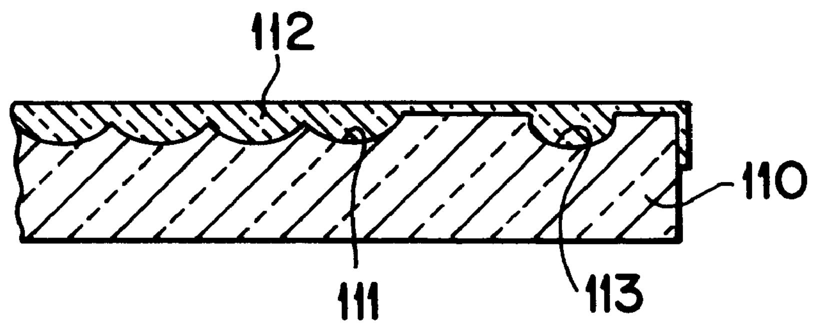
FIG. 9 shows a cross-section view of the a conventional planar micro-lens array.

FIG. 6 shows a liquid crystal display element, to which is applied the planar micro-lens array 10 obtained in the manner mentioned above. The liquid crystal display element 20 defines a cell by bonding the glass substrate 21 onto a glass substrate 22 through a spacer 23, and on the glass substrate 22 forming cells there is contacted a lens-forming surface comprising the planar micro-lens array 10 through a low refractive index material 24, such as a fluorine group resin, acrylic resin group or epoxy resin group, etc. Thereafter, liquid crystal 25 is filled inside the space defined between the glass substrate 21 and the glass substrate 22, so as to complete the liquid crystal display element 20.

Further, on the surface of the glass substrate 21 or 22, at the side of the liquid crystal 25, there are previously formed opposing electrodes 26, while pixel electrodes 27 are formed on the surface of the glass substrate 21 at the side of the liquid crystal 25.

As is fully explained above, in accordance with the present invention, there is no necessity to treat the glass substrate to be the micro-lens array with an etching process during each time when forming thereof, thereby greatly simplifying the process of production thereof.

Further, since the trap portion is formed all around the stamper, continuing until the outer edge thereof, any excess high refractive index resin will not be forced out during the forming process. And, since any excess high refractive index resin will not be disadvantageously forced out, the high refractive index resin coating film will not be torn or damaged when cutting plural lens arrays from a large glass substrate. Also, when forming a planar micro-lens array on a glass substrate using the method according to the invention, it is easy to insert a jig between the glass substrate and the stamper. Therefore, the manufacturing processes for producing the planar micro-lens array(s) becomes easy, and any possibility that the glass substrate and/or the stamper might be injured is significantly reduced.

What is claimed is:

1. A stamper for use in forming a planar micro-lens array, the lens array being formed by a plurality of convex portions of high refractive resin material applied onto a planar surface of a glass substrate, in which, after the high refractive resin material is applied onto plural concave portions of said stamper, the planar glass substrate is contacted thereon to exude the resin in between the concave portions and the glass plate, and the resin is then cured and released therefrom, herein the plurality of concave portions for forming lens elements of said micro-lens array are formed on a stamping surface of said stamper by transcription or etching, and wherein a trap portion is formed at an outer periphery of said lens elements of said stamping surface of said stamper by transcription or etching having a depth substantially equal to that of said concave portions, extending at least to an outer peripheral edge of a region where said glass substrate is to be contacted therewith and being open to the periphery at the outer peripheral edge of the region where the substrate is to be contacted therewith.

2. A stamper as defined in claim 1, wherein said stamper is formed with laminated layers of nickel, which are formed by an electro-forming process, upon a surface of a master plate of said micro-lens array.

3. A stamper as defined in claim 1, wherein upon a surface of a glass plate as a model of said stamper there are formed a plurality of small concave portions by wet etching, wherein a reverse mold is formed with laminated layers of nickel, which are formed by performing an electro-forming process upon the surface of the glass substrate having said plural concave portions, and wherein said stamper is formed with laminated layers of nickel by the electro-forming process upon the surface of the reverse mold having said plural convex portions thereon.

4. A stamper as defined in claim 1, wherein said stamper is formed with a glass substrate, upon a surface of which are formed a large number of concave portions by wet etching.

5. A stamper for use in forming a planar micro-lens array as defined in any one of claims 1 to 4, wherein in the stamping surface of said stamper there are formed plural groups of concave portions, corresponding to plural planar micro-lens arrays, each being separate, and said trap portion is formed at each outside periphery of concave portions for each planar micro-lens array, having a depth substantially equal to that of said concave portions.

6. A method for forming a planar micro-lens by use of the stamper as defined in any one of claims 1 to 4, comprising steps of:

turning a stamping surface of said stamper upward, upon which surface is applied a release agent;

applying high refractive resin material upon the stamping surface of said stamper;

pressing a glass substrate upon the high refractive resin material to exude the high refractive resin material into the concave portions and then curing the high refractive resin material to form the lens portions and thereafter;

releasing the stamper to leave the planar micro-lens array formed on said glass surface; and again applying the release agent upon a molding surface of said stamper after the release thereof, in preparation for a subsequent process.

7. A method for forming a planar micro-lens by use of the stamper as defined in claim 5, wherein a separate piece of glass substrate is prepared for the concave portions of each planar micro-lens array.

8. A method for forming a planar micro-lens by use of the stamper as defined in claim 5, comprising steps of:

turning a stamping surface of said stamper upward, upon which surface is applied a release agent;

applying high refractive resin material upon the stamping surface of said stamper;

pressing a glass substrate upon the high refractive resin material to exude the high refractive resin material into the concave portions and then curing the high refractive resin material to form the lens portions and thereafter;

releasing the stamper to lave the planar micro-lens array formed on said glass surface; and again applying the release agent upon a molding surface of said stamper after the release thereof, in preparation for a subsequent process.

9. A stamper for forming a planar micro-lens array comprising a plurality of convex lens element portions of high refractive resin material applied onto a planar surface of a glass substrate, the planar surface having an outer peripheral edge, said stamper comprising:

a main body providing a stamping surface;

a lens element forming portion comprising a plurality of concave portions provided on said stamping surface, said concave portions being configured to form the convex lens element portions of said high refractive resin material during a stamping operation wherein said resin material is compressed between said lens element forming portion and the planar surface of said glass substrate such that any excess resin is exuded peripherally outwardly from an outer peripheral edge of said lens element forming portion;

a concave trap portion positioned with respect to the outer peripheral edge of said lens element forming portion such that during said stamping operation said concave trap portion extends peripherally beyond the outer peripheral edge of the planar surface of the glass substrate so as to be open at the outer peripheral edge of the planar surface of the glass substrate, said concave trap portion being configured to receive any excess resin exuded from the outer peripheral edge of said lens element forming portion during said stamping operation.

10. A lens forming system comprising:

a high refractive resin material;

a glass substrate having a planar surface, said planar surface having an outer peripheral edge;

a stamper comprising:

a main body providing a stamping surface;

a lens element forming portion comprising a plurality of concave portions provided on said stamping surface, said concave portions being configured to form a plurality of convex lens elements in said resin material during a stamping operation wherein said resin material is compressed between said lens element forming portion and said planar surface of said glass substrate such that any excess resin is exuded peripherally outwardly from an outer peripheral edge of said lens element forming portion;

a concave trap portion positioned with respect to said outer peripheral edge of said lens element forming portion such that during said stamping operation said concave trap portion extends peripherally beyond the outer peripheral edge of the planar surface of said glass substrate so as to be open at the outer peripheral edge of said planar surface, said concave trap portion being configured to receive any excess resin material exuded from the outer peripheral edge of said lens element forming portion during said stamping operation.

11. A method for forming a planar micro-lens array, said method comprising:

providing a glass substrate having a planar surface, said planar surface having an outer peripheral edge;

providing a stamper comprising:

(i) a main body providing a stamping surface, (ii) a lens element forming portion comprising a plurality of concave lens forming portions, and (iii) a concave trap portion adjacent an outer peripheral edge of said lens forming portion;

applying a release agent to said lens forming portion;

orienting said stamper such that said stamping surface thereof faces generally upwardly;

applying a high refractive resin material to said lens forming portion;

positioning said glass substrate adjacent the applied resin material such that the concave trap portion extends peripherally beyond the outer peripheral edge of the planar surface of said glass substrate so as to be open at the outer peripheral edge of said planar surface;

compressing said resin material between said planar surface and said lens element forming portion such that said plurality of concave portions form a plurality of convex lens elements in said resin material and such that any excess resin material is exuded peripherally outwardly into said open concave trap portion; and curing said compressed resin material.

* * * * *